United States Patent
Peng et al.

(10) Patent No.: US 9,881,654 B2
(45) Date of Patent: Jan. 30, 2018

(54) POWER SOURCE FOR MEMORY CIRCUITRY

(71) Applicant: MACRONIX INTERNATIONAL CO., LTD., Hsinchu (TW)

(72) Inventors: Wu-Chin Peng, Hsinchu (TW); Chun-Yi Lee, Hsinchu (TW); Ken-Hui Chen, Hsinchu (TW); Kuen-Long Chang, Hsinchu (TW); Chun Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/877,723

(22) Filed: Oct. 7, 2015

(65) Prior Publication Data

US 2016/0203846 A1  Jul. 14, 2016

Related U.S. Application Data

(60) Provisional application No. 62/103,285, filed on Jan. 14, 2015.

(51) Int. Cl.
*G11C 5/14* (2006.01)
(52) U.S. Cl.
CPC .................... *G11C 5/145* (2013.01)
(58) Field of Classification Search
CPC ...................................... G11C 5/145
USPC ........................ 365/226; 327/538
See application file for complete search history.

(56) References Cited

U.S. PATENT DOCUMENTS

| | | | |
|---|---|---|---|
| 4,912,346 A | 3/1990 | Mizuta | |
| 5,422,586 A * | 6/1995 | Tedrow ................ | H02M 3/073 327/100 |
| 5,625,544 A | 4/1997 | Kowshik et al. | |
| 5,734,286 A | 3/1998 | Takeyama et al. | |
| 5,734,290 A | 3/1998 | Chang et al. | |
| 5,889,428 A | 3/1999 | Young | |
| 6,100,557 A | 8/2000 | Hung et al. | |
| 6,230,280 B1 | 5/2001 | Okasaka | |
| 6,366,519 B1 | 4/2002 | Hung et al. | |
| 6,476,665 B2 | 11/2002 | Buchschacher | |
| 6,525,972 B2 | 2/2003 | Yanagisawa | |

(Continued)

FOREIGN PATENT DOCUMENTS

| CN | 1173023 A | 2/1998 |
|---|---|---|
| CN | 101317320 A | 12/2008 |

(Continued)

OTHER PUBLICATIONS

Office Action from U.S. Appl. No. 14/877,692 dated May 2, 2016, 8 pages.

*Primary Examiner* — Anthan Tran
(74) *Attorney, Agent, or Firm* — Haynes Beffel & Wolfeld LLP

(57) ABSTRACT

An integrated circuit comprises a power supply input pin receiving an off-chip supply voltage having a variable current, an on-chip power source powered by the off-chip supply voltage and providing a regulated current, a memory array, and a set of one or more circuits coupled to the memory array and powered by the regulated current from the on-chip power source. The IC can include control circuitry performing memory operations on the memory array, said control circuitry powered by at least the off-chip supply voltage from the power supply pin.

18 Claims, 12 Drawing Sheets

(56) References Cited

U.S. PATENT DOCUMENTS

| | | |
|---|---|---|
| 6,560,145 B2 | 5/2003 | Marlines et al. |
| 6,573,780 B2 | 6/2003 | Lin et al. |
| 6,650,172 B1 | 11/2003 | Shingyouchi |
| 6,683,809 B2 | 1/2004 | Matsuda et al. |
| 6,768,366 B2 | 7/2004 | Kuo et al. |
| 6,914,791 B1 | 7/2005 | Park et al. |
| 7,098,725 B2 | 8/2006 | Lee |
| 7,113,442 B2 | 9/2006 | Kurihara |
| 7,251,162 B2 | 7/2007 | Kawajiri et al. |
| 7,323,926 B2 | 1/2008 | Chen et al. |
| 7,327,171 B2 | 2/2008 | Lvich |
| 7,443,739 B2 | 10/2008 | Barth |
| 7,502,267 B2 | 3/2009 | Lin et al. |
| 7,525,853 B2 | 4/2009 | Kitazaki et al. |
| 7,595,682 B2 | 9/2009 | Lin et al. |
| 7,808,301 B2 | 10/2010 | Chen et al. |
| 7,944,718 B2 | 5/2011 | Takano |
| 8,339,185 B2 | 12/2012 | Cazzaniga et al. |
| 8,598,854 B2 | 12/2013 | Soenen et al. |
| 9,214,859 B2 | 12/2015 | Lin et al. |
| 2002/0114184 A1 | 8/2002 | Gongwer et al. |
| 2004/0183114 A1* | 9/2004 | Eshel ............... G11O 5/145 257/300 |
| 2005/0248322 A1* | 11/2005 | Kagemoto ......... H05B 33/0815 323/220 |
| 2006/0174140 A1* | 8/2006 | Harris ..................... G11C 5/04 713/300 |
| 2007/0096796 A1 | 5/2007 | Firmansyah et al. |
| 2007/0126494 A1 | 6/2007 | Pan |
| 2008/0316834 A1 | 12/2008 | Chae et al. |
| 2009/0108915 A1 | 4/2009 | Liao |
| 2010/0171544 A1 | 7/2010 | Seo |
| 2010/0237931 A1 | 9/2010 | Ogiwara et al. |
| 2011/0115551 A1 | 5/2011 | Hung et al. |
| 2012/0049937 A1 | 3/2012 | El Waffaoui |
| 2012/0275225 A1 | 11/2012 | Huynh et al. |
| 2012/0306506 A1* | 12/2012 | Kiuchi ............... G01R 31/3658 324/434 |
| 2013/0027120 A1 | 1/2013 | Lo et al. |
| 2013/0127436 A1 | 5/2013 | Hu et al. |
| 2013/0205141 A1 | 8/2013 | Solihin |
| 2014/0189407 A1 | 7/2014 | Byun et al. |

FOREIGN PATENT DOCUMENTS

| | | |
|---|---|---|
| CN | 102043417 A | 5/2011 |
| TW | 201008098AL | 2/2010 |

* cited by examiner

CHARGE PUMP STAGE 400

CHARGE PUMP STAGE 500

CHARGE PUMP STAGE 600

S 9,881,654 B2

POWER SOURCE FOR MEMORY CIRCUITRY

PRIORITY APPLICATION

This application claims the benefit of U.S. Provisional Patent Application No. 62/103,285, filed 14 Jan. 2015 entitled A Low Power Application to Stable Power Consumption of Memory With Different Voltage Supply. This application is incorporated by reference herein.

BACKGROUND

Field of the Invention

This technology relates to power sources for memory circuitry such as charge pumps.

Description of Related Art

As process sizes continue to shrink for nonvolatile memory such as flash memory, lowering power consumption of the memory circuitry becomes even more critical. Power consumption of memory circuitry is determined by current consumption, because power=voltage×current=current$^2$×resistance.

Certain types of memory circuitry rely on a higher supply voltage than the lower supply voltage provided as an input to the integrated circuit which includes the memory array. Examples of such circuitry include charge pumps and output drivers.

Charge pumps and output drivers also draw relatively large peak currents. Voltage boosting circuits and multi-phase clocks are example of other types of memory circuitry that draw relatively large peak currents, and which may or may not rely on a higher supply voltage.

Such types of circuitry that rely on a higher supply voltage than the lower voltage supplied to the integrated circuit, and/or that draw relatively large peak currents, consume varying amounts of power. Peak powers can damage the power source of the integrated circuit which includes the memory array.

It would be desirable to control peak power consumption of an integrated circuit.

SUMMARY

One aspect of the technology is an integrated circuit comprising a power supply input pin, an on-chip power source, a memory array, and a set of one or more circuits coupled to the memory array and powered by the regulated current from the on-chip power source.

The power supply input pin receives an off-chip supply voltage having a variable current. The on-chip power source is powered by the off-chip supply voltage and provides a regulated current. The set of one or more circuits is coupled to the memory array and powered by the regulated current from the on-chip power source.

In some embodiments of the technology, the set of one or more circuits includes a charge pump. In various embodiments of the technology, the charge pump includes a plurality of serially coupled charge pump stages arranged to pump charge from a first stage to a last stage of the plurality. The charge pump stages of the plurality include an input node, an output node, a pass transistor electrically coupling the input node and the output node, a first boost capacitor coupled to the output node, and a second boost capacitor coupled to a gate of the pass transistor.

In some embodiments of the technology, the on-chip power source provides the regulated current to at least one of: (i) the first boost capacitors, (ii) the second boost capacitors, and (iii) the input node of a first stage.

In some embodiments of the technology, a particular stage of the charge pump stages includes a first transistor selectively electrically coupling an input node of the particular stage and an output node of the particular stage, and a second transistor selectively electrically coupling the input node and a gate of the first transistor.

In some embodiments of the technology, the particular stage is in a well surrounded by a plurality of well contacts.

In some embodiments of the technology, the input node is defined by a first region in the well. The output node is defined by a second region in the well. The first region and the second region are on opposite sides of the gate of the first transistor. The first region has a first distance from a nearest one of the plurality of well contacts averaged along a first perimeter of the first region. The second region has a second distance from another nearest one of the plurality of well contacts averaged along a second perimeter of the first region. The first distance is longer than the second distance.

In some embodiments of the technology, the input node is defined by a plurality of first regions in the well. The output node is defined by a second region in the well. The second region is in between the plurality of first regions.

In some embodiments of the technology, the on-chip power source includes a plurality of parallel current sources that in combination provide the regulated current provided by the on-chip power source.

In some embodiments of the technology, the on-chip power source includes a reference current source, and a plurality of transistors having at least two different widths. At least a first one of the plurality of transistors is in series with the reference current source. At least a second one of the plurality of transistors provides an output current determined by a ratio of the different widths of at least the first and the second ones of the plurality of transistors.

In some embodiments of the technology, the on-chip power source includes an operational amplifier in a loop from a gate of at least the first one of the plurality of transistors to the reference current source.

In some embodiments of the technology, the on-chip power source has a nominal output voltage that is independent of the off-chip supply voltage.

In some embodiments of the technology, the set of one or more circuits includes a capacitive boosting circuit.

In some embodiments of the technology, the set of one or more circuits includes an output driver.

In some embodiments of the technology, the set of one or more circuits includes a clock circuit.

Another aspect of the technology is a method comprising:
receiving, at an integrated circuit, off-chip supply voltage having a variable current via a power supply input pin;
providing, in the integrated circuit, a regulated current with an on-chip power source powered by the off-chip supply voltage; and
powering, with the regulated current from the on-chip power source, a set of one or more circuits on the integrated circuit coupled to a memory array on the integrated circuit.

Various embodiments are disclosed herein.

DETAILED DESCRIPTION

Figure 1:
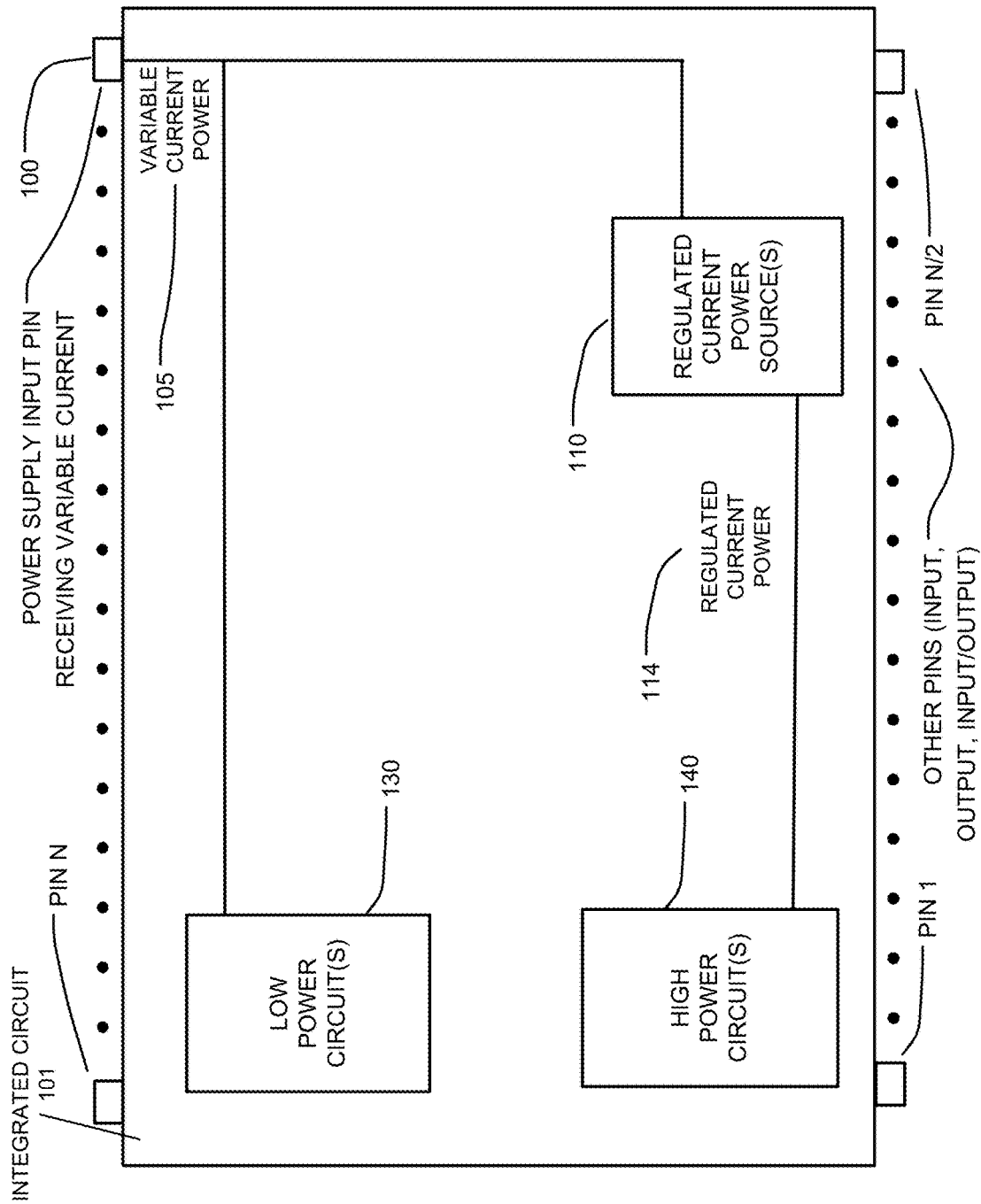
FIG. 1 is a block diagram of an integrated circuit that receives external power with variable current, and internally generates regulated current power for high power circuits.

FIG. 1 is a block diagram of an integrated circuit that receives external power with variable current, and internally generates regulated current power for high power circuits.

In FIG. 1, integrated circuit 101 is a in a package with pins numbered 1 to N that receive and send signals, and receive power. Pin 100 is a power supply input pin receiving variable current, typically at a fixed nominal voltage or voltage range. As the internal circuits of integrated circuit 101 draw varying amounts of power or current, the total current drawn through pin 100 varies. The variable current power 105 drawn through power supply input pin 100 is received by low power circuit(s) 130 and regulated current power source(s) 110. Although the current drawn by low power circuit(s) 130 varies with time, the maximum current drawn by low power circuit(s) 130 is less than the regulated current generated by regulated current power source(s) 110. Accordingly, peaks in the variable current power consumed by low power circuit(s) 130 do not damage the external power supply which provides pin 100 with power. The current drawn through pin 100 that is consumed by regulated current power source(s) 110 is also a regulated current.

High power circuit(s) 140 draw on regulated current generated by regulated current power source(s) 110. Because the peak current that can be drawn by high power circuit(s) 140 is limited by the regulated current, peaks in the total power consumption of the integrated circuit 101 will not damage the external power supply which provides pin 100 with power. When the regulated current generated by regulated current power source(s) 110 is not consumed by high power circuit(s) 140, then the regulated current power source(s) 110 stops generating current.

Integrated circuit 101 is designed so that the regulated current is sufficient, based on the consumed current or the maximum peak current of the system specification.

Figure 2:
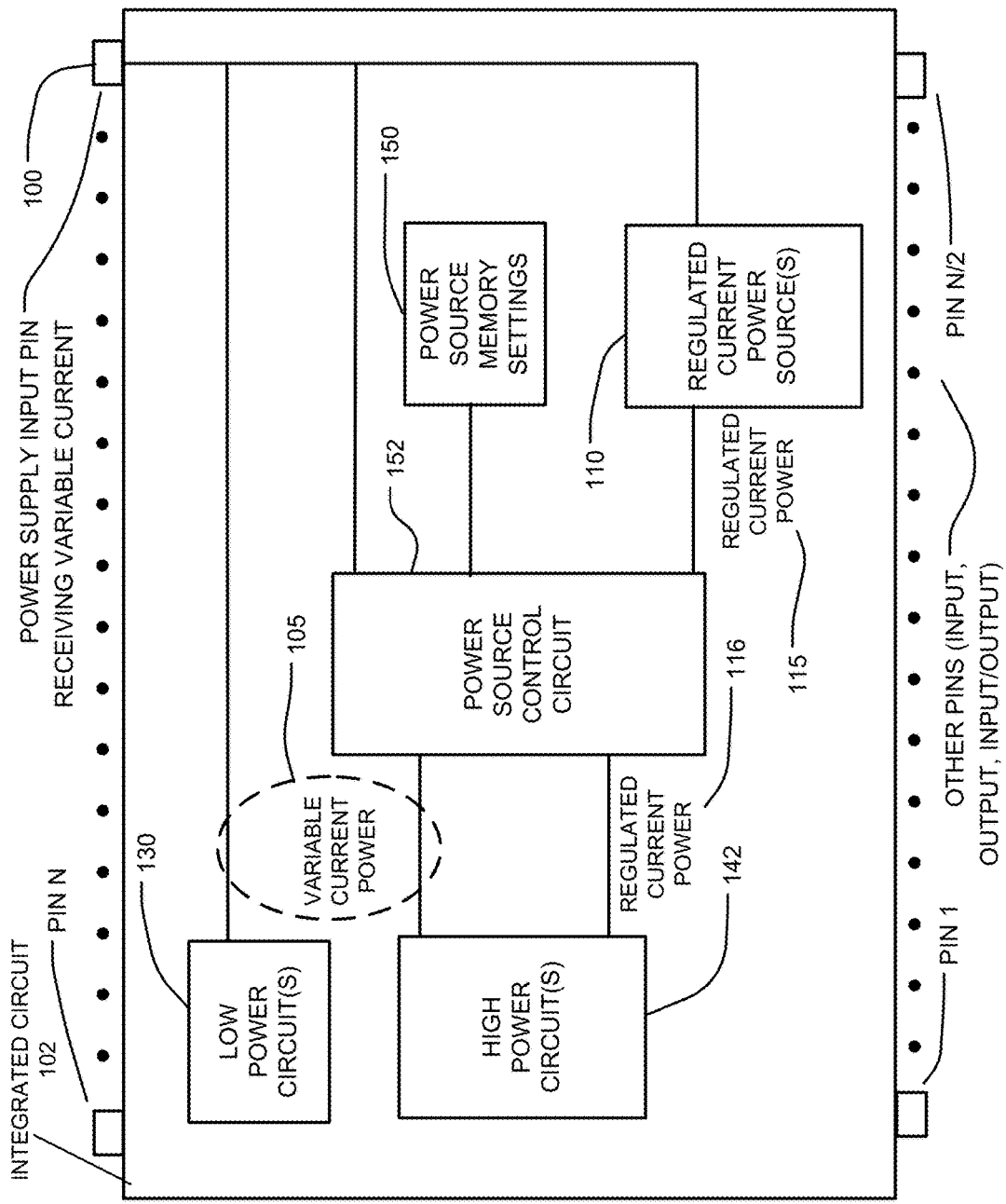
FIG. 2 is a block diagram of an integrated circuit, similar to FIG. 1, that receives external power with variable current, internally generates regulated current power, and switches the power source of high power circuits between variable current power and regulated current power.

FIG. 2 is a block diagram of an integrated circuit 102, similar to FIG. 1, that receives external power with variable current, internally generates regulated current power, and switches the power source of high power circuits between variable current power and regulated current power.

Power source memory settings 150 store preferences on whether particular ones high power circuit(s) 142 or parts thereof draw power from the variable current power 105 supplied by power supply input pin 100, or the regulated current power 115 supplied by regulated current power source(s) 110. The affected particular high power circuit(s) 142 can be a subset or all of the high power circuit(s) 142. The power source memory settings 150 can be nonvolatile memory such as fuses, flash, or nitride charge trapping cells, or volatile memory such as RAM. The power source control circuit 152, depending on the contents of power source memory settings 150, controls whether particular high power circuit(s) 142 or parts thereof draw power from the variable current power 105 supplied by power supply input pin 100, or the regulated current power 115 supplied by regulated current power source(s) 110. Power source memory settings 150 and power source control circuit 152, add flexibility as to the amount and type of high power circuit(s) 142 which draw on the regulated current power 115 from regulated current power source(s) 110. An example of a power source control circuit includes a switch circuit with multiple selectable current paths. An example of power source memory settings 150 has memory elements such as fuses, or deposited metal to select the current path.

Figure 3:
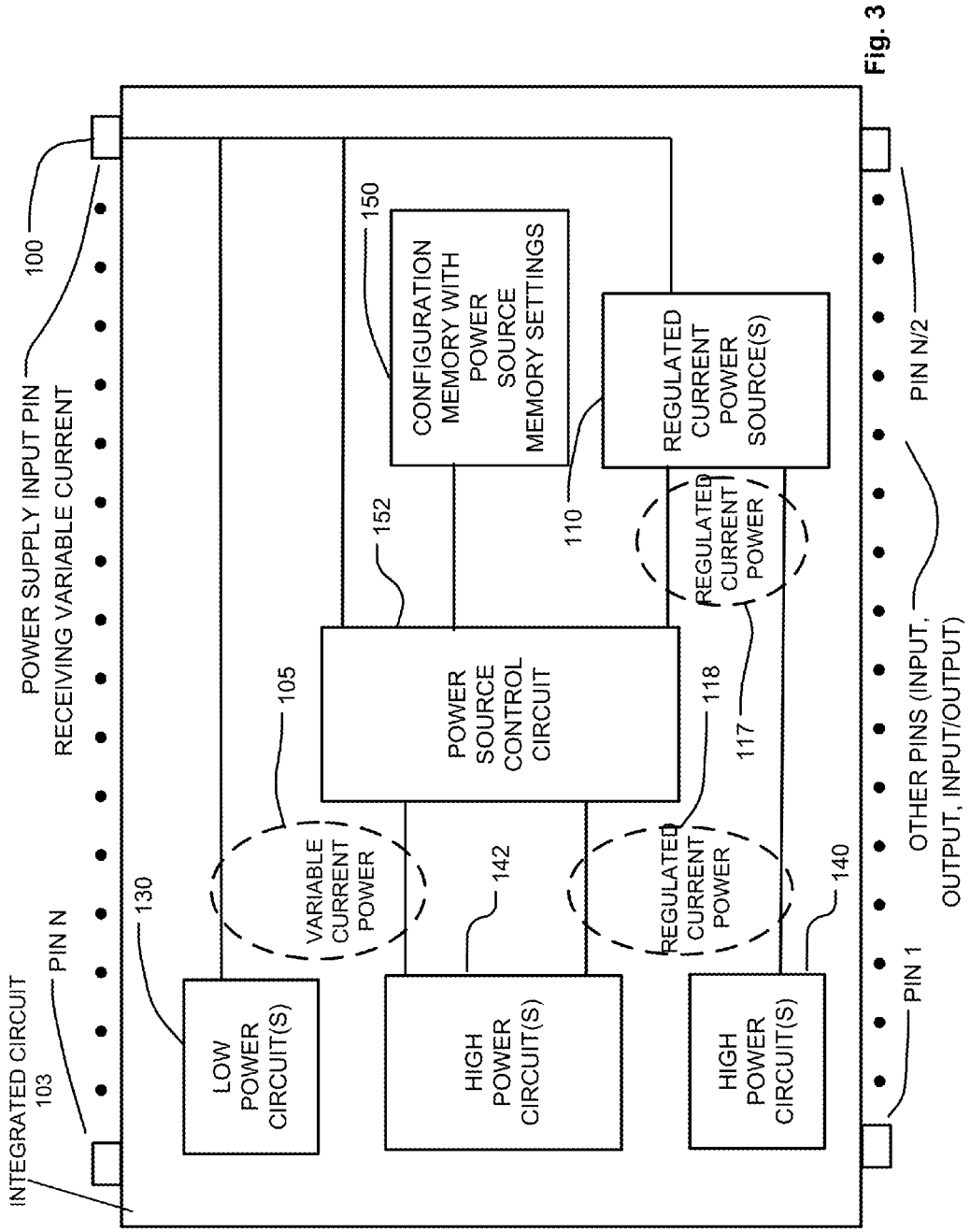
FIG. 3 is a block diagram of an integrated circuit, similar to FIGS. 1 and 2, that receives external power with variable current, internally generates regulated current power, and switches the power source of only some high power circuits between variable current power and regulated current power.

FIG. 3 is a block diagram of an integrated circuit 103, similar to FIGS. 1 and 2, that receives external power with variable current, internally generates regulated current power, and switches the power source of only some high power circuits between variable current power and regulated current power.

Integrated circuit 103 includes both high power circuit(s) 140 as in FIG. 1 and high power circuit(s) 142 as in FIG. 2. High power circuit(s) 140 draw on the regulated current 117 generated from regulated current power source(s) 110 regardless of the contents of power source memory settings 150. On the other hand, high power circuit(s) 142 draw power from the variable current power 105 from power supply input pin 100, or the regulated current power 115 from regulated current power source(s) 110, depending on the preferences stored in power source memory settings 150.

On the one hand, power source memory settings 150 and power source control circuit 152, add flexibility as to the amount and type of high power circuit(s) 142 which draw on the regulated current power 115 from regulated current power source(s) 110. On the other hand, by fixing high power circuit(s) 140 to draw on the regulated current 117 generated from regulated current power source(s) 110, complexity is reduced for power source memory settings 150 and power source control circuit 152

In some embodiments, the regulated current power source provides one total output current which is constant. In other embodiments, the regulated current power source provides multiple output currents, each of which is constant. The multiple output currents can have same values or different values.

Figure 4:
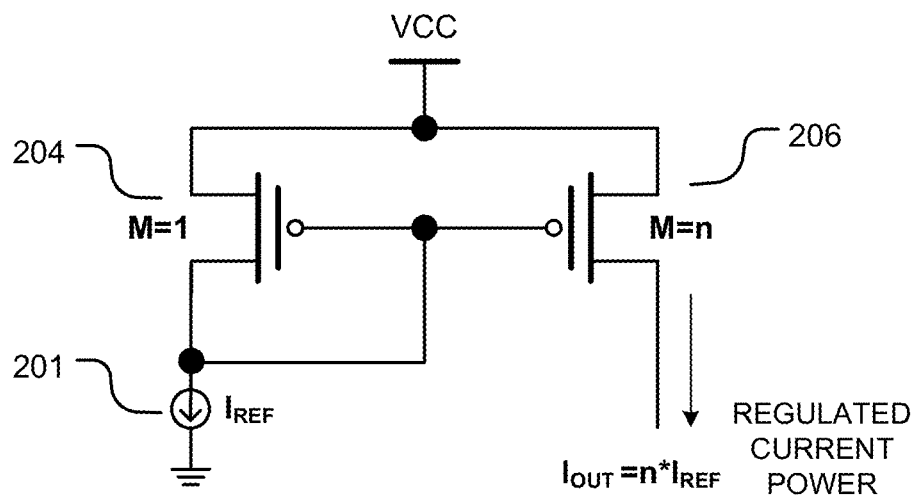
FIG. 4 is a simplified circuit diagram of a power source that generates regulated current that is scaled from a regulated current source.

FIG. 4 is a simplified circuit diagram of a power source that generates regulated current that is scaled from a regulated current source.

The reference current source 201 generates a reference current that is scaled by the regulated current power source. The reference current source 201 can be a Vcc supply voltage independent current source. Other example reference current sources can include a temperature-independent reference and/or a bandgap reference. A diode-connected p-type transistor 204 is coupled between supply voltage VCC and current reference IREF 201. Current reference IREF 201 is coupled between p-type transistor 204 and a reference voltage such as ground. P-type transistor 206 has a source coupled to supply voltage VCC, a gate coupled to the cathode of diode-connected p-type transistor 204, and a drain which provides an output of regulated current power. This current output scales the current of reference current source 201 by the ratio of the widths of p-type transistor 206 and p-type transistor 204.

Figure 4A:
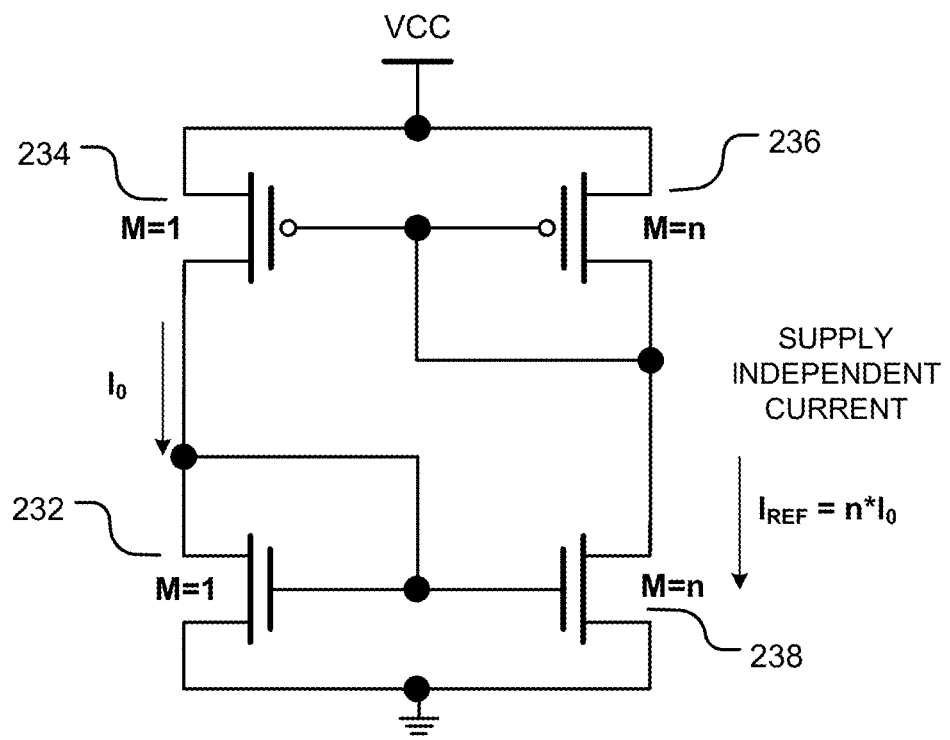
FIG. 4A is a simplified circuit diagram of an example supply voltage independent current source that can be used in the current source of FIGS. 4 and 5.
Figure 5:
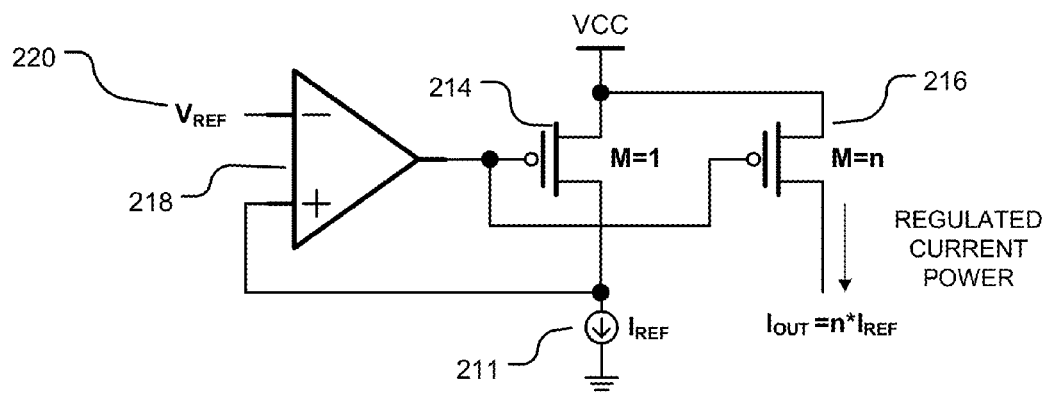
FIG. 5 is a simplified circuit diagram of a power source including an op amp that generates regulated current that is scaled from a regulated current source.

FIG. 4A is a simplified circuit diagram of an example supply voltage independent current source that can be used in a regulated current power source such as FIGS. 4 and 5.

An example supply voltage independent current source has a first pair of series-coupled transistors between a supply voltage and another reference voltage such as ground. The first pair of series-coupled transistors includes first p-type transistor 234 and first n-type transistor 232. The example supply voltage independent current source also has a second pair of series-coupled transistors between the supply voltage and ground. The second pair of series-coupled transistors includes second p-type transistor 236 and second n-type transistor 238. The first n-type transistor 232 has a source coupled to ground. The first n-type transistor 232 has a gate and a drain coupled to each other, to a gate of the second n-type transistor 238, and to a drain of the first p-type transistor 234. The first p-type transistor 234 has a source coupled to the supply voltage and a gate coupled to a gate and a drain of the second p-type transistor 236. The second p-type transistor 236 has a source coupled to the supply voltage. The second p-type transistor 236 has the gate and the drain coupled to each other, to the gate of the first p-type transistor, and to a drain of the second n-type transistor 238. The second n-type transistor 238 has a source coupled to ground, a gate coupled to the gate and the drain of the second p-type transistor 236, and a drain coupled to the gate and the drain of the second p-type transistor 236. The example supply voltage independent current source can define the currents with a series resistance in between the second p-type transistor 236 and the supply voltage, and/or in between the second n-type transistor 238 and ground.

FIG. 5 is a simplified circuit diagram of a power source including an op amp that generates regulated current that is scaled from a regulated current source.

The reference current source 211 generates a reference current that is scaled by the regulated current power source. The reference current source 211 can be a Vcc supply voltage independent current source. Other example reference current sources can include a temperature-independent reference and/or a bandgap reference. A p-type transistor 214 is coupled in series between supply voltage VCC and current reference IREF 211. Current reference IREF 211 is coupled between p-type transistor 214 and a reference voltage such as ground. P-type transistor 216 has a source coupled to supply voltage VCC, a gate coupled to the gate of p-type transistor 214, and a drain which provides an output of regulated current power. This current output scales the current of reference current source 211 by the ratio of the widths of p-type transistor 216 and p-type transistor 214.

An operation amplifier 218 has an inverting input coupled to voltage reference VREF 220, a noninverting input coupled to a node between current reference IREF 211 and the drain of p-type transistor 214, and an output coupled to the gates of p-type transistor 216 and p-type transistor 214. An example of voltage reference VREF 220 includes a bandgap reference or a scaled output of a bandgap reference.

Figure 6:
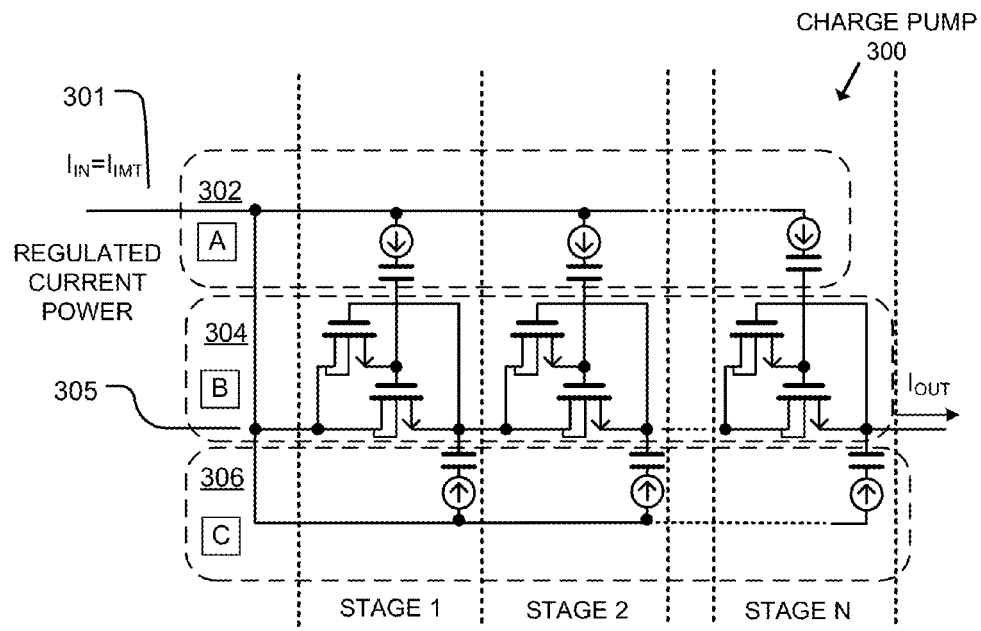
FIG. 6 is a simplified circuit diagram of a multi-stage charge pump powered by a regulated current source.

FIG. 6 is a simplified circuit diagram of a multi-stage charge pump 300 powered by a regulated current source.

The multi-stage charge pump is an example of a high-power circuit that can be powered by regulated current power source 301. Details of a typical charge pump stage are discussed in connection with FIG. 10. Each stage of a charge pump includes boost drive 302 (also labeled A) for the pass transistor powered by a current source, the pumped nodes and main transistors 304 (also labeled B), and the boost capacitor 306 (also labeled C) powered by a current source. The boost drive 302 and boost capacitor 306 of a charge pump stage are noted for high power/high current consumption, and draw power from regulated current power source 301. Also, the first stage of the charge pump has an input node 305 noted for high power/high current consumption, that also draws power from regulated current power source 301.

Figure 7:
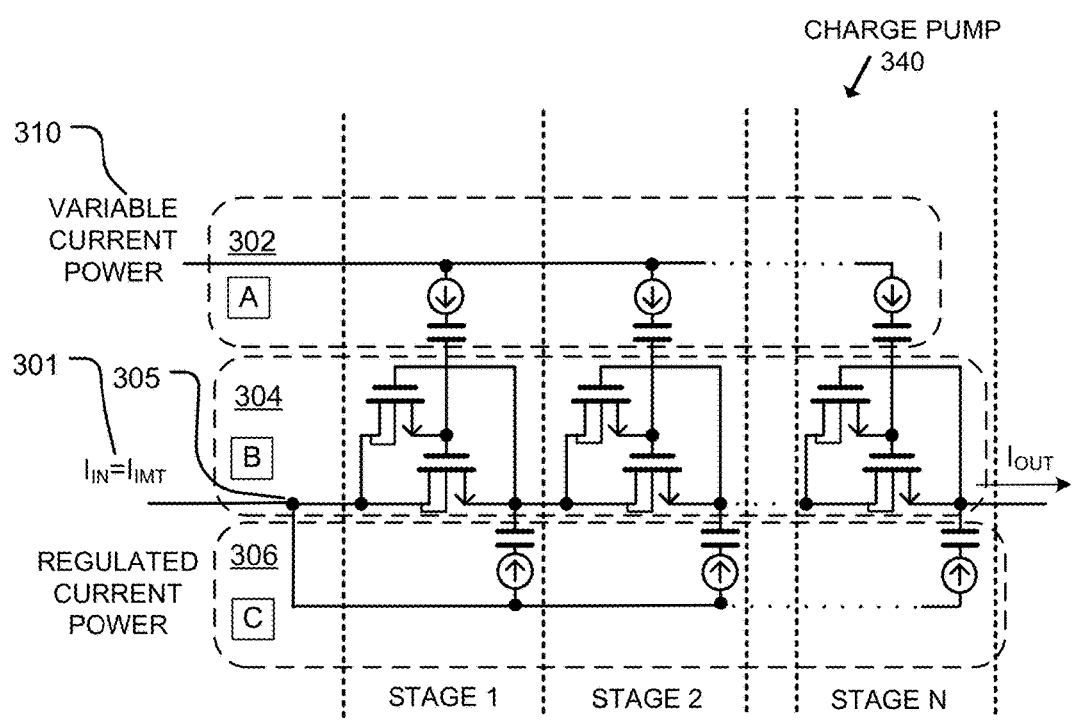
FIG. 7 is a simplified circuit diagram of a multi-stage charge pump powered by a regulated current source and a variable current source.

FIG. 7 is a simplified circuit diagram of a multi-stage charge pump 340 powered by a regulated current source and a variable current source.

Unlike the multi-stage charge pump of FIG. 6, only some of the high power/high current parts of the multi-stage charge pump draw power from regulated current power source 301. The first stage of the charge pump has an input node 305 that draws power from regulated current power source 301. Boost capacitor 306 for all stages (also labeled C) also draws power from regulated current power source 301. However, boost drive 302 for all stages (also labeled A) for the pass transistor draws power from the variable current power source 310.

Figure 8:
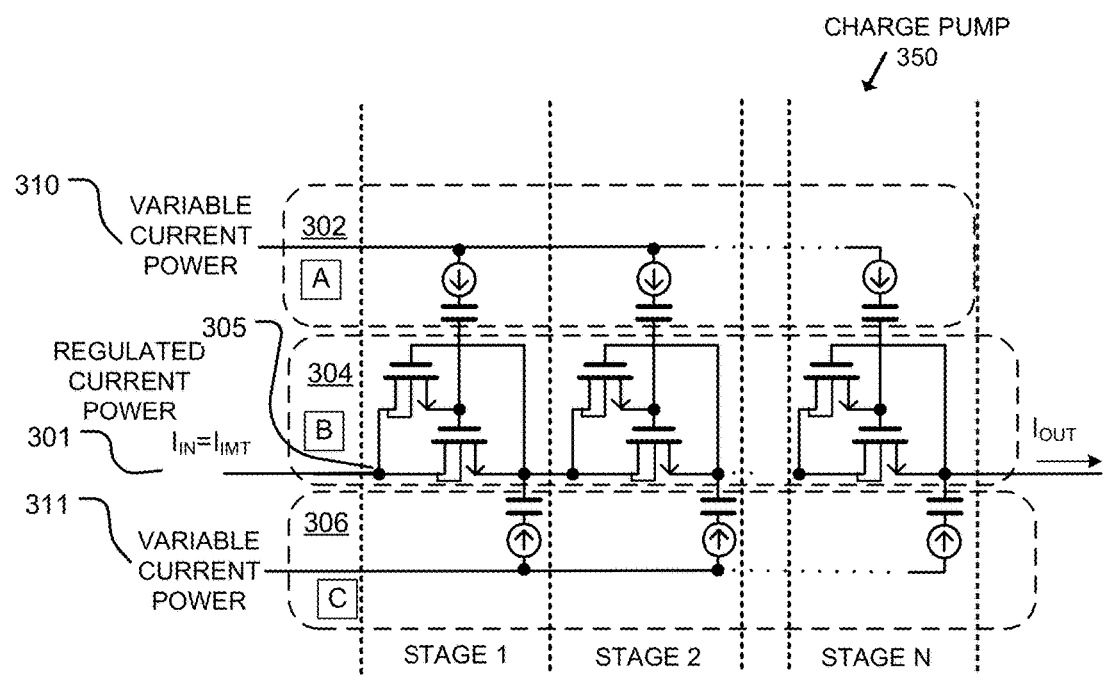
FIG. 8 is a simplified circuit diagram of a multi-stage charge pump powered by a regulated current source and a variable current source, with an assignment of charge pump components to the regulated current source and the variable current source that varies from FIG. 7.

FIG. 8 is a simplified circuit diagram of a multi-stage charge pump 350 powered by a regulated current source and a variable current source, with an assignment of charge pump components to the regulated current source and the variable current source that varies from FIG. 7.

The first stage of the charge pump has an input node 305 draws power from regulated current power source 301. However, boost drive 302 for all stages (also labeled A) for the pass transistor draws power from the variable current power source 310. Also, boost capacitor 306 for all stages (also labeled C) also draws power from variable current power source 310.

Other embodiments are directed to the other combinations of assignments of charge pump components to the regulated current source and the variable current source.

Figure 9:
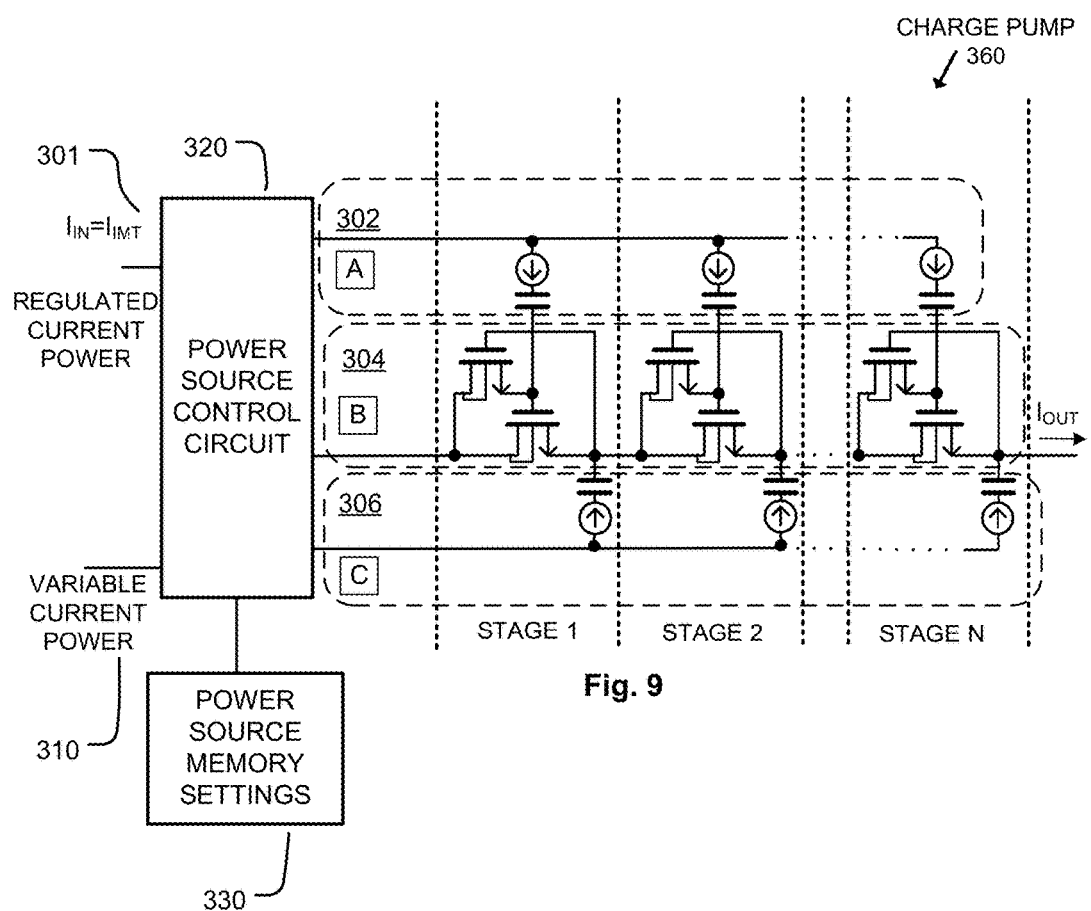
FIG. 9 is a simplified circuit diagram of a multi-stage charge pump powered by a regulated current source and a variable current source, with an assignment of charge pump components to the regulated current source and the variable current source that is controlled by memory settings.

FIG. 9 is a simplified circuit diagram of a multi-stage charge pump 360 powered by a regulated current source and a variable current source, with an assignment of charge pump components to the regulated current source and the variable current source that is controlled by memory settings.

Power source memory settings 330 store preferences on whether particular charge pump circuits draw power from the variable current power 310, or the regulated current power 301 from regulated current power source 301. Responsive to power source memory settings 330, power source control circuit 320 controls whether boost drive 302 for all stages (also labeled A) for the pass transistor, the pumped nodes and main transistors 304 for the first stage (also labeled B), and the boost capacitor 306 for all stages (also labeled C) draw power from the variable current power 310, or the regulated current power 301 from regulated current power source 301.

In other embodiments, parts of the charge pump draw power for a power source responsive to power source memory settings 330, and other parts of the charge pump draw power permanently draw power from variable current power 310. Alternatively, parts of the charge pump draw power for a power source responsive to power source memory settings 330, and other parts of the charge pump draw power permanently draw power from regulated current power 301. In a further alternative, parts of the charge pump draw power for a power source responsive to power source memory settings 330, other parts of the charge pump draw power permanently draw power from variable current power 310, and yet other parts of the charge pump draw power permanently draw power from regulated current power 301.

Figure 10:
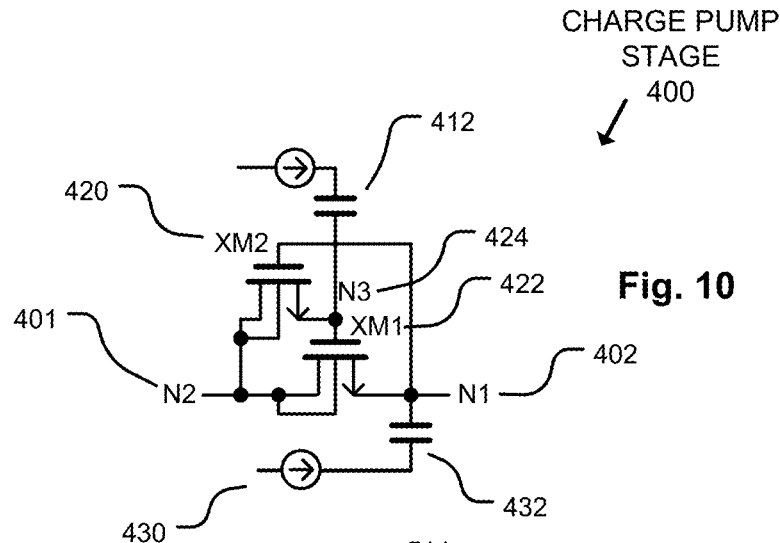
FIG. 10 is a simplified circuit diagram of a stage of a multi-stage charge pump powered by a regulated current source and a variable current source according to FIG. 7, 8, or 9.

FIG. 10 is a simplified circuit diagram of a stage of a multi-stage charge pump powered by a regulated current source and a variable current source according to FIG. 7, 8, or 9.

Transistor XM1 422 selectively electrically couples input node N2 401 and output node N1 402. Transistor XM2 420 selectively electrically couples input node N2 401 and the gate of transistor XM1, node N3 424. Capacitor 412 is the boost drive for node N3, powered by a current source. Capacitor 432 is the boost capacitor for node N1 402, powered by a current source. Capacitor 432 is driven by inverter 430.

Figure 11:
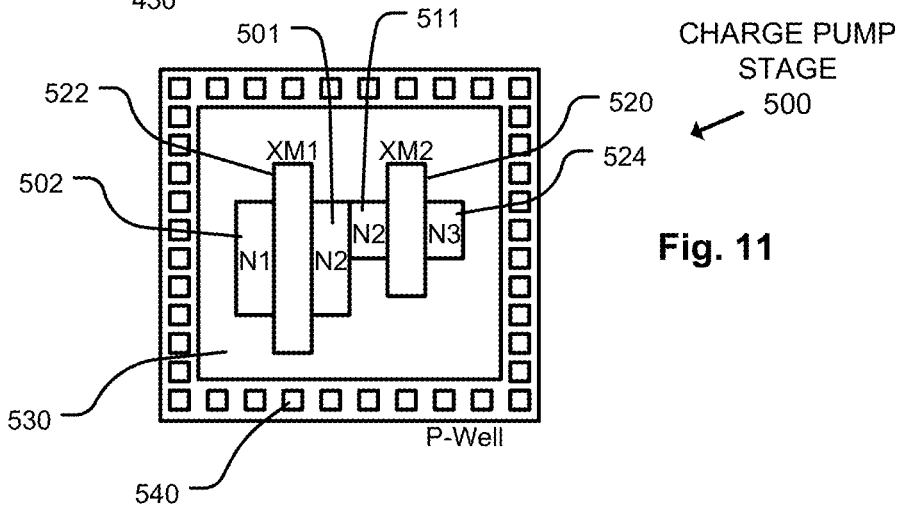
FIG. 11 is a simplified layout of a stage of a multi-stage charge pump as in FIG. 10, with a varying proximity of the charge pump nodes to the well-contacts at the periphery of the well.

FIG. 11 is a simplified layout of a stage of a multi-stage charge pump as in FIG. 10, with a varying proximity of the charge pump nodes to the well contacts at the periphery of a well region.

The stage of the multi-stage charge pump is surrounded by p-well contacts 540 for the p-well region 530. Transistor XM1 has gate 522 which selectively electrically couples node N1 502 and node N2 501 on opposite sides of gate 522. Transistor XM2 has a gate 520 which selectively electrically couples node N2 511 and node N3 524 on opposite sides of gate 520. The distance from node N2 501 to one nearest well contact, averaged over the perimeter of node N2 501, is longer than the distance from node N1 502 to another nearest well contact, averaged over the perimeter of node N1 502. The distance from node N2 511 to one nearest well contact, averaged over the perimeter of node N2 511, is longer than the distance from node N3 524 to another nearest well contact, averaged over the perimeter of node N3 524. A nearest well contact is a well contact that is nearest to a respective node, on average, averaged over the perimeter of the respective node.

Figure 12:
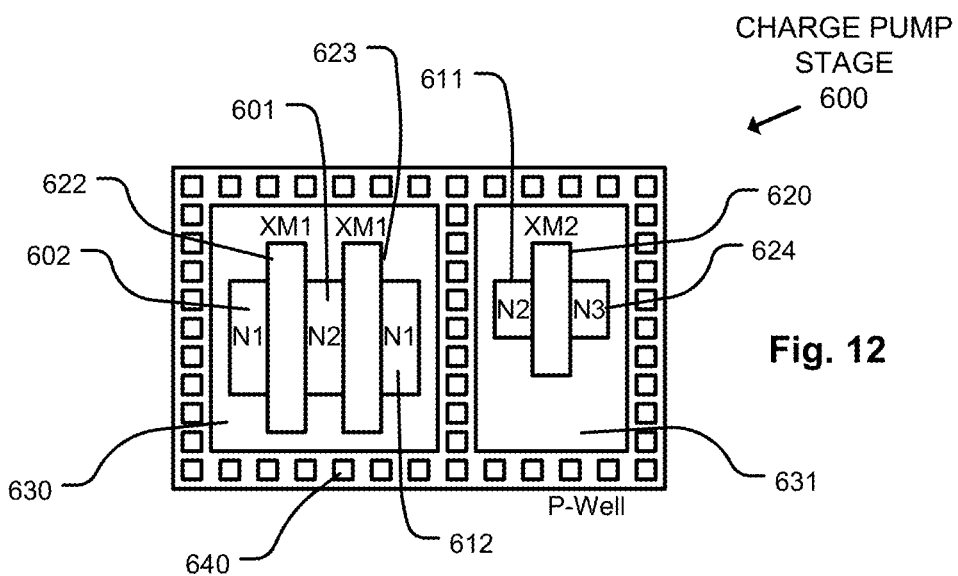
FIG. 12 is an alternative to the simplified layout of a stage of a multi-stage charge pump of FIG. 11.

FIG. 12 is an alternative to the simplified layout of a stage of a multi-stage charge pump of FIG. 11.

Transistor XM1 has a first gate 622 which selectively electrically couples node N1 602 and node N2 601 on opposite sides of first gate 622. Transistor XM1 has a second gate 623 which selectively electrically couples node N1 612 and node N2 601 on opposite sides of second gate 623. The input node N2 601 is between output node N1 602 and output node N1 612.

Transistor XM2 has a gate 620 which selectively electrically couples node N2 611 and node N3 624 on opposite sides of gate 620.

The stage of the multi-stage charge pump is surrounded by p-well contacts 640 for the p-wells 630 and 631. Transistors XM1 and XM2 are each surrounded by well contacts 640, such that some of well contacts 640 are in between transistors XM1 and XM2

Figure 13:
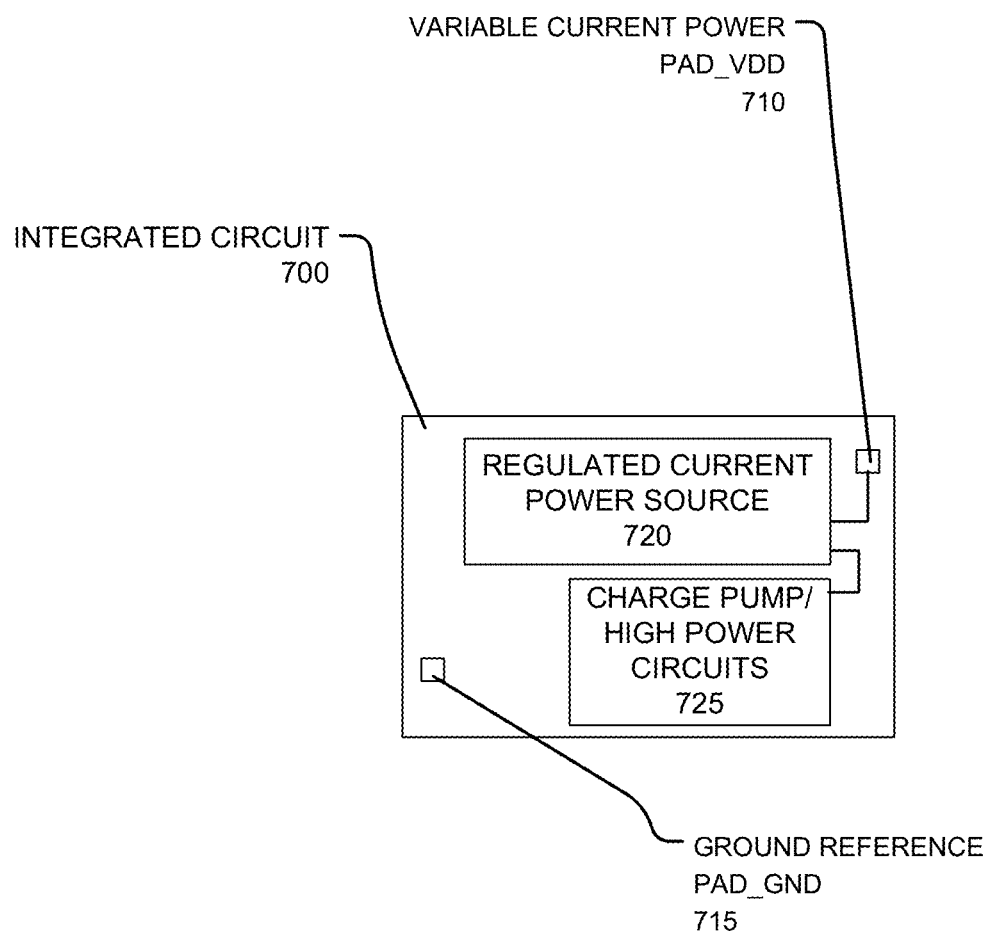
FIG. 13 is a simplified block diagram of an integrated circuit that receives external power with variable current, and internally generates regulated current power for high power circuits, with varying proximity of the circuitry to the pads.

FIG. 13 is a simplified block diagram of an integrated circuit that receives external power with variable current, and internally generates regulated current power for high power circuits, with proximity of the circuitry to the pads that depends on the particular pads.

Integrated circuit 700 includes regulated current power source 720 and high current/high power circuits 725 such as a charge pump. The regulated current power source 720 draws power from variable current power pad VDD 710, and is coupled also to ground reference pad GND 715. Variable current power pad VDD 710 and ground reference pad GND 715 are in turn coupled to respective pins of the IC package. The regulated current power source 720 is closer to the variable current power pad VDD 710 than to the ground reference pad GND 715. High current/high power circuits 725 also are closer to the variable current power pad VDD 710 than to the ground reference pad GND 715.

Figure 14:
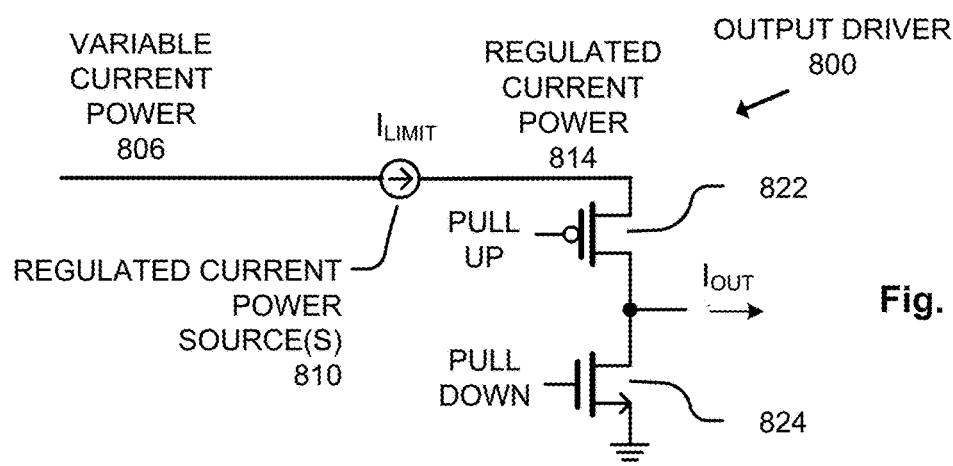
FIG. 14 is a simplified circuit diagram of an output driver as an example of a high power circuit in the integrated circuit of FIG. 1, 2, or 3.

FIG. 14 is a simplified circuit diagram of an output driver 800 as an example of a high power circuit in the integrated circuit of FIG. 1, 2, or 3.

Variable current power 806 is received by regulated current power source 810. Regulated current power source 810 in turn generates regulated current power 814. Pull up p-type transistor 822 and pull down n-type transistor 824 are coupled in series between regulated current power source 810 and a reference voltage such as ground. A node in series between pull up p-type transistor 822 and pull down n-type transistor 824 is the output of output driver 800.

Figure 15:
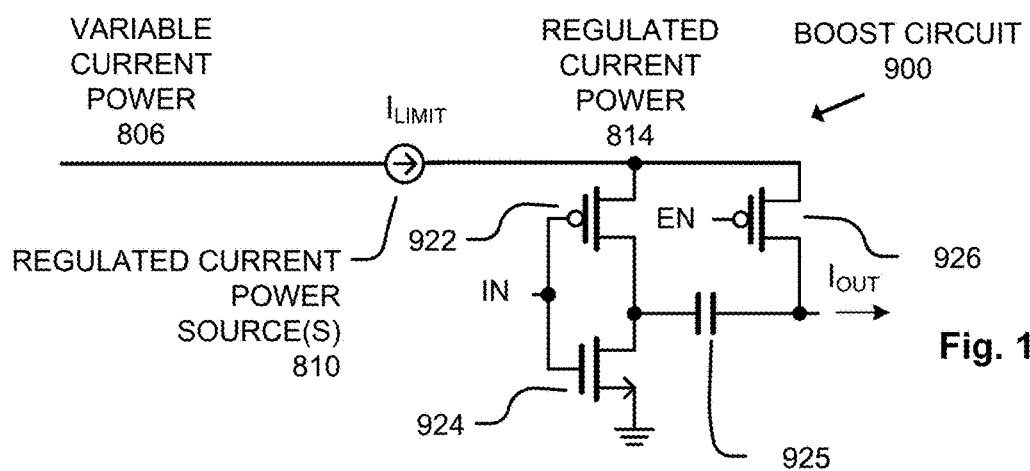
FIG. 15 is a simplified circuit diagram of a boost circuit as an example of a high power circuit in the integrated circuit of FIG. 1, 2, or 3.

FIG. 15 is a simplified circuit diagram of a boost circuit 900 as an example of a high power circuit in the integrated circuit of FIG. 1, 2, or 3.

Variable current power 806 is received by regulated current power source 810. Regulated current power source 810 in turn generates regulated current power 814. An inverter including p-type transistor 922 and n-type transistor 924 is coupled between regulated current power source 810 and a reference voltage such as ground. A boost capacitor 925 is coupled between the output of the inverter and the output of the boost circuit 900. An enable circuit includes a p-type transistor 926 coupled between regulated current power source 810 and the output of the boost circuit 900. P-type transistor 926 receives signal EN that selectively enables the boost circuit 900.

Other high power circuits that draw on regulated current include transistors of larger size relative to other transistors on the integrated circuit.

Figure 16:
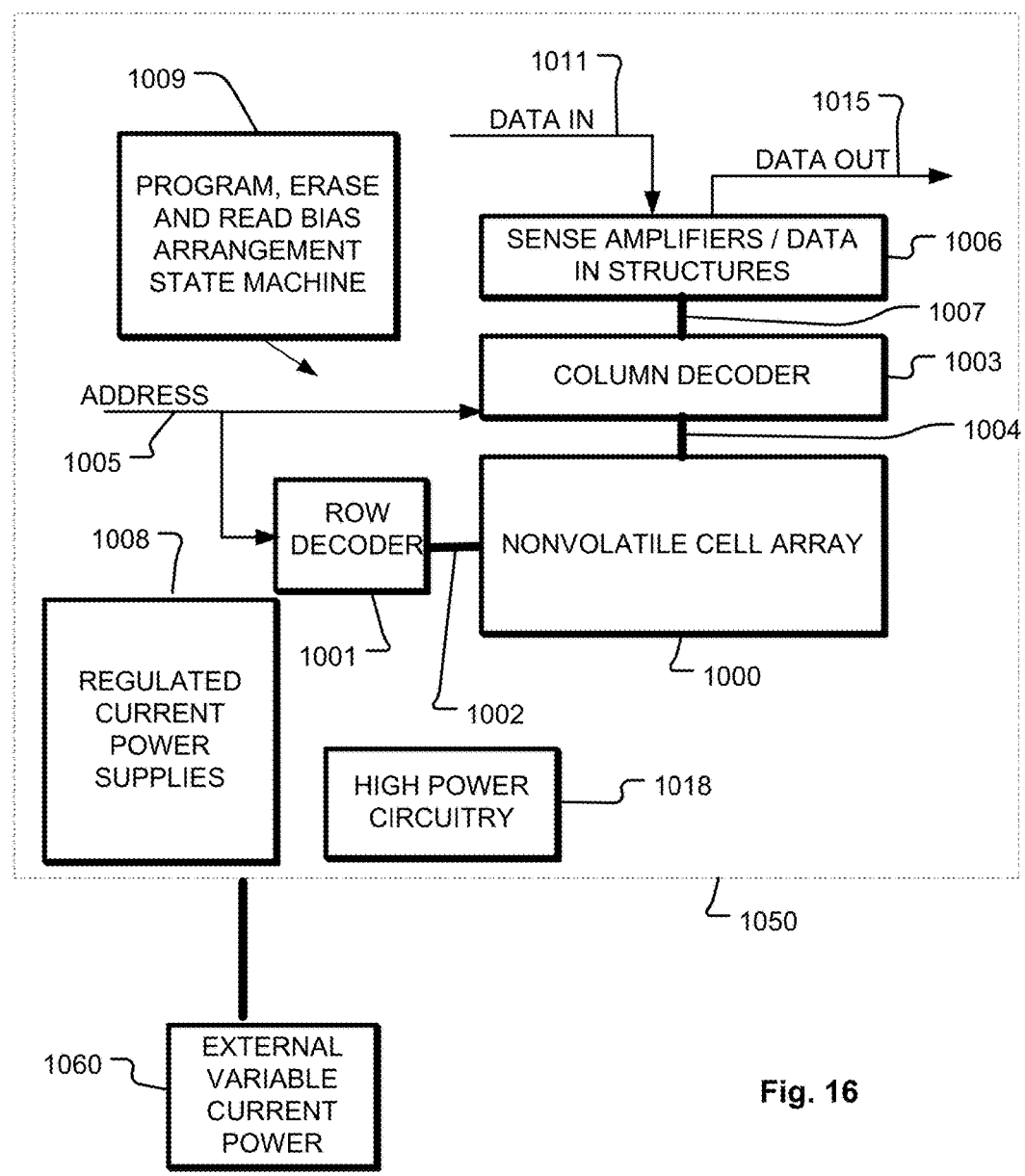
FIG. 16 is a block diagram of an integrated circuit that receives external power with variable current, and internally generates regulated current power for high power circuits.

FIG. 16 is a block diagram of an integrated circuit that receives external power with variable current, and internally generates regulated current power for high power circuits.

An integrated circuit 1050 includes a memory array 1000 such as a nonvolatile cell array. A word line decoder 1001 is coupled to and in electrical communication with a plurality of word lines 1002 arranged along rows in the memory array 1000. A bit line (column) decoder 1003 is in electrical communication with a plurality of bit lines 1004 arranged along columns in the array 1000. Addresses are supplied on bus 1005 to the word line decoder 1001 and bit line decoder 1003. Sense circuitry (sense amplifiers) and data-in structures in block 1006, including voltage and/or current sources are coupled to bit line decoder 1003 via data bus 1007. Data is supplied via a data-in line 1011 from input/output ports on integrated circuit 1050, or from other data sources internal or external to integrated circuit 1050, to data-in structures in block 1006. Other circuitry may be included on integrated circuit 1050, such as a general purpose processor or special purpose application circuitry, or a combination of modules providing system-on-a-chip functionality supported by array 1000. Data is supplied via a data-out line 1015 from the sense amplifiers in block 1006 to input/output ports on integrated circuit 1050, or to other data destinations internal or external to integrated circuit 1050.

A controller 1009 implemented in this example, using a bias arrangement state machine, controls the application of regulated current supply voltages 1008 to high power circuits 1018 such as charge pump circuitry, output drivers, and boost circuits. Controller 1009 may be responsive to power source memory settings to determine whether particular ones or parts of the high power circuits 1018 draw power from the regulated current power supplies 1008. The controller 1009 also controls application of bias arrangements including read, program, erase, erase verify and program verify voltages and/or currents for the word lines and bit lines. Controller 1009 may be implemented using special-purpose logic circuitry as known in the art. In alternative embodiments, controller 1009 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1009.

External variable current power 1060 provides external power to the integrated circuit 1050.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit comprising:
   a power supply input pin receiving an off-chip supply voltage having a variable current;
   an on-chip power source powered by the off-chip supply voltage and providing a charging current, the on-chip power source including:
   a reference current source providing a reference current having a reference current magnitude $I_{REF}$; and
   a plurality of transistors having at least two different widths, wherein at least a first one of the plurality of transistors is in series with the reference current source, and at least a second one of the plurality of transistors provides the charging current having a peak current magnitude limited by the reference current magnitude scaled by a ratio of the different widths of at least the first and the second ones of the plurality of transistors; and
   a memory array; and
   a set of one or more circuits coupled to the memory array and comprising a boost capacitor charged by the charging current from the on-chip power source.

2. The integrated circuit of claim 1, wherein the set of one or more circuits includes a charge pump.

3. The integrated circuit of claim 1, wherein the set of one or more circuits includes a charge pump, the charge pump including:
   a plurality of serially coupled charge pump stages arranged to pump charge from a first stage to a last stage of the plurality,
   wherein the charge pump stages of the plurality include an input node, an output node, a pass transistor electrically coupling the input node and the output node, a first boost capacitor coupled to the output node, and a second boost capacitor coupled to a gate of the pass transistor, and wherein the first mentioned boost capacitor is one of the first boost capacitor and the second boost capacitor of one of the charge pump stages in the plurality of serially coupled charge pump stages.

4. The integrated circuit of claim 1, wherein the set of one or more circuits includes a charge pump, the charge pump including:
   a plurality of serially coupled charge pump stages arranged to pump charge from a first stage to a last stage of the plurality,
   wherein the charge pump stages of the plurality include an input node, an output node, a pass transistor electrically coupling the input node and the output node, a first boost capacitor coupled to the output node, and a second boost capacitor coupled to a gate of the pass transistor, and wherein the first mentioned boost capacitor is one of the first boost capacitor and the second boost capacitor of one of the charge pump stages in the plurality of serially coupled charge pump stages,
   wherein the on-chip power source provides charging current to at least one of:
   (i) the first boost capacitors of the plurality of serially coupled charge pump stages, (ii) the second boost capacitors of the plurality of serially coupled charge pump stages, and (iii) the input node of a first stage, and wherein the first mentioned boost capacitor is one of the first boost capacitor and the second boost capacitor of one of the charge pump stages in the plurality of serially coupled charge pump stages.

5. The integrated circuit of claim 1, wherein the set of one or more circuits includes a charge pump, the charge pump including:
   a plurality of serially coupled charge pump stages arranged to pump charge from a first stage to a last stage of the plurality, wherein a particular stage of the charge pump stages includes:
   a first transistor selectively electrically coupling an input node of the particular stage and an output node of the particular stage, a second transistor selectively electrically coupling the input node and a gate of the first transistor, wherein the particular stage is in a well surrounded by a plurality of well contacts, and wherein the input node is defined by a first region in the well, the output node is defined by a second region in the well, the first region and the second region on opposite sides of the gate of the first transistor, the first region having a first distance from a nearest one of the plurality of well contacts averaged along a first perimeter of the first region, the second region having a second distance from another nearest one of the plurality of well contacts averaged along a second perimeter of the first region, the second distance shorter than the first distance.

6. The integrated circuit of claim 1, wherein the set of one or more circuits includes a charge pump, the charge pump including:

a plurality of serially coupled charge pump stages arranged to pump charge from a first stage to a last stage of the plurality, wherein a particular stage of the charge pump stages includes:

a first transistor selectively electrically coupling an input node of the particular stage and an output node of the particular stage, a second transistor selectively electrically coupling the input node and a gate of the first transistor, wherein the particular stage is in a well surrounded by a plurality of well contacts, and wherein the input node is defined by a first region in the well, the output node is defined by a plurality of second regions in the well, and the first region is in between the plurality of second regions.

7. The integrated circuit of claim 1, wherein the plurality of transistors includes a third transistor providing a third transistor current having a peak current magnitude limited by the reference current magnitude scaled by a ratio of the different widths of the first and the third transistors of the plurality of transistors.

8. The integrated circuit of claim 1, wherein the on-chip power source includes:

an operational amplifier in a loop from a gate of at least the first one of the plurality of transistors to the reference current source.

9. The integrated circuit of claim 1, wherein the on-chip power source has a nominal output voltage that is independent of the off-chip supply voltage.

10. The integrated circuit of claim 1, wherein the set of one or more circuits includes a capacitive boosting circuit.

11. The integrated circuit of claim 1, wherein the set of one or more circuits includes an output driver.

12. The integrated circuit of claim 1, wherein the set of one or more circuits includes a clock circuit.

13. A method comprising:

receiving, at an integrated circuit, off-chip supply voltage having a variable current via a power supply input pin;

providing, in the integrated circuit, a charging current with an on-chip power source powered by the off-chip supply voltage, wherein the on-chip power source includes:

a reference current source providing a reference current having a reference current magnitude $I_{REF}$; and a plurality of transistors having at least two different widths, wherein at least a first one of the plurality of transistors is in series with the reference current source, and at least a second one of the plurality of transistors provides the charging current having a peak current magnitude limited by the reference current magnitude scaled by a ratio of the different widths of at least the first and the second ones of the plurality of transistors; and powering, with the charging current from the on-chip power source, a set of one or more circuits on the integrated circuit coupled to a memory array on the integrated circuit, the one or more circuits including a boost capacitor charged by the charging current.

14. The method of claim 13, wherein the set of one or more circuits includes a charge pump.

15. The method of claim 13, wherein the set of one or more circuits includes a charge pump, the charge pump including:

a plurality of serially coupled charge pump stages arranged to pump charge from a first stage to a last stage of the plurality, wherein the charge pump stages of the plurality include an input node, an output node, a pass transistor electrically coupling the input node and the output node, a first boost capacitor coupled to the output node, and a second boost capacitor coupled to a gate of the pass transistor, wherein the on-chip power source provides charging current to at least one of:

(i) the first boost capacitors of the plurality of charge pump stages, (ii) the second boost capacitors of the plurality of charge pump stages, and (iii) the input node of a first stage, and wherein the first mentioned boost capacitor is one of the first boost capacitor and the second boost capacitor of one of the charge pump stages in the plurality of serially coupled charge pump stages.

16. The method of claim 13, wherein the set of one or more circuits includes a charge pump, the charge pump including:

a plurality of serially coupled charge pump stages arranged to pump charge from a first stage to a last stage of the plurality, wherein a particular stage of the charge pump stages includes:

a first transistor selectively electrically coupling an input node of the particular stage and an output node of the particular stage, a second transistor selectively electrically coupling the input node and a gate of the first transistor, wherein the particular stage is in a well surrounded by a plurality of well contacts, and wherein the input node is defined by a first region in the well, the output node is defined by a second region in the well, the first region and the second region on opposite sides of the gate of the first transistor, the first region having a first distance from a nearest one of the plurality of well contacts averaged along a first perimeter of the first region, the second region having a second distance from another nearest one of the plurality of well contacts averaged along a second perimeter of the first region, the first distance shorter than the second distance.

17. The method of claim 13, wherein the set of one or more circuits includes a charge pump, the charge pump including:

a plurality of serially coupled charge pump stages arranged to pump charge from a first stage to a last stage of the plurality, wherein a particular stage of the charge pump stages includes:

a first transistor selectively electrically coupling an input node of the particular stage and an output node of the particular stage, a second transistor selectively electrically coupling the input node and a gate of the first transistor, wherein the particular stage is in a well surrounded by a plurality of well contacts, and wherein the input node is defined by a first region in the well, the output node is defined by a plurality of second regions in the well, and the first region is in between the plurality of second regions.

18. The method of claim 13, wherein the on-chip power source includes:

an operational amplifier in a loop from a gate of at least the first one of the plurality of transistors to the reference current source.

* * * * *